United States Patent
Nairn

[19]

[11] Patent Number: 6,011,433
[45] Date of Patent: Jan. 4, 2000

[54] GENERALIZED PROCEDURE FOR THE CALIBRATION OF SWITCHED CAPACITOR GAIN STAGES

[75] Inventor: David Graham Nairn, High Point, N.C.

[73] Assignee: PMC-Sierra Ltd., Burnaby, Canada

[21] Appl. No.: 09/176,749

[22] Filed: Oct. 22, 1998

[51] Int. Cl.[7] .............................. G01R 19/00; H03F 1/14
[52] U.S. Cl. ................................................. 330/2; 330/51
[58] Field of Search .................. 330/2, 51, 107, 330/109; 327/554

[56] References Cited

U.S. PATENT DOCUMENTS

| | | | |
|---|---|---|---|
| 4,524,425 | 6/1985 | Bertails | 330/107 |
| 4,543,534 | 9/1985 | Temes et al. | 330/109 |
| 4,988,900 | 1/1991 | Fensch | 327/554 |
| 5,514,997 | 5/1996 | Quinn | 327/554 |
| 5,847,600 | 12/1998 | Brooks et al. | 330/51 |

*Primary Examiner*—Robert Pascal
*Assistant Examiner*—Patricia T. Nguyen
*Attorney, Agent, or Firm*—Pascal & Associates

[57] ABSTRACT

Within the field of integrated circuits used in amplifiers, a structure and improved method for calibrating a switched capacitor gain stage wherein the time required to self-calibrate a switched capacitor gain stage and the associated structure are reduced. The invention utilizes only a single calibration step which is performed while the output of the amplifier being calibrated is monitored. Instead of utilizing a plurality of capacitors $C_{a1}$–$C_{an}$ each in parallel with groups of trim capacitors $C_T$, a single capacitor $C_a$ is used and connected to switches $S_{1a1}$ and $S_{1b1}$. Further, instead of a group of trim capacitors $C_T$ being connected in parallel with the capacitor to be trimmed, each of plurality of trim capacitors $C_{T1}$–$C_{TN}$ is connected between the input to the operational amplifier and a respective corresponding switch $S_{1a2}$–$S_{1aN}$ to the input reference voltage node $V_{b0}$. As well, switches $S_{1b2}$–$S_{1bn}$ connect the respective junctions between the trim capacitors $C_{T1}$–$C_{TN}$ to ground.

8 Claims, 3 Drawing Sheets

GENERALIZED PROCEDURE FOR THE CALIBRATION OF SWITCHED CAPACITOR GAIN STAGES

FIELD OF THE INVENTION

This invention relates to the field of integrated circuits, and in particular to a structure and improved method for calibrating a switched capacitor gain stage.

BACKGROUND TO THE INVENTION

Amplifiers with precise integer gains are required in many analog-to-digital converters and digital-to-analog converters. While relatively precise gains can be obtained with switched-capacitor gain stages, their accuracy is limited to about 1 part in 1000 due to mismatches in the capacitor ratios. Therefore, to achieve higher accuracy, the capacitor ratio must be trimmed. This is referred to herein as calibrating a switched capacitor gain stage.

As shown in FIG. 1, a capacitor C typically is trimmed by adding an array of smaller trim capacitors $C_{T1}$–$C_{TN}$ in parallel with the capacitor C to be trimmed (which trim capacitors are shown also as a variable capacitor). The trim capacitors are connected in parallel with the capacitor C by switches $S_1$–$S_N$. The switches can be implemented either as fusible links or as field effect transistors.

Circuits with fusible links are trimmed during manufacturing and can only be used once. This process is both expensive and does not correct for possible component drifts due to time and temperature.

Circuits which use field effect transistor switches, allow the capacitor to be trimmed after manufacturing, throughout the life of the integrated circuit. This leads to a lower manufacturing cost and to better long-term accuracy.

FIG. 2 illustrates a switched capacitor gain stage which is to be trimmed, using the notation of the variable capacitor instead of showing discrete trim capacitors. An operational amplifier 1 has its non-inverting input connected to ground, and its output connected via a switch S3 to its inverting input. Its inverting input is also connected via a capacitor $C_b$ and a switch $S_{5b}$ to a voltage reference $V_r$. The junction of switch $S_{5b}$ and the capacitor $C_b$ is also connected via switch $S_{5a}$ to ground, and via switch $S_4$ to the output of the operational amplifier.

The inverting input of the operational amplifier is connected via capacitors $C_{a1}$–$C_{an}$ (each of which has the nominal value of capacitor $C_b$), to input voltage Vi (which has the value $V_r$), via respective switches $S_{1a}$–$S_{na}$. The junctions of capacitors $C_{a1}$–$C_{aN}$ and switches $S_{1a}$–$S_{4N}$ are connected via respective switches $S_{1b}$–$S_{nb}$ to ground.

Variable trim capacitors $C_T$ are connected in parallel with respective capacitors $C_{a1}$–$C_{aN}$.

This circuit can be used to provide integer gains. The gain depends on how many of the input capacitors ($C_{a1}$, $C_{a2}$, . . .) are connected to $V_i$ during the sampling phase. To obtain accurate gains, each of the input capacitors must equal the feedback capacitor ($C_b$). Since the method requires that the capacitors to be trimmed be equal, each of the input capacitors must be trimmed individually.

To trim capacitor $C_{a1}$, the inputs to all the other input capacitors are connected to ground. Capacitor $C_{a1}$ is then connected to a reference voltage, $V_i=V_r$, through switch $S_{1a}$ while $C_b$ is connected to ground through $S_{5a}$. The operational amplifier's output is shorted to its inverting input with switch $S_3$. Switch $S_4$ is permanently opened in calibration mode. This is the sample/reset phase.

Then switches $S_{1a}$, $S_{5a}$, and $S_3$ are opened. Capacitor $C_{a1}$ is then connected to ground through switch $S_{1b}$ while capacitor $C_b$ is connected to voltage $V_r$ through switch $S_{5b}$. This is the amplify/compare phase. During this phase the operational amplifier's output voltage $V_o$ is compared to $V_r$. If $V_o$ is greater than $V_r$, then capacitor $C_{a1}$ is too big. If $V_o$ is less than $V_r$ then capacitor $C_{a1}$ is too small. Capacitor $C_{a1}$ is then adjusted and the sample/reset and amplify/compare cycle is repeated, until the best trim setting is found.

The above method suffers from two main limitations. Firstly, for gains greater than one, multiple input (unit) capacitors must be used and both a separate trim array and trim routine must be used for each input capacitor. Hence, for a gain of two, two trim arrays and two trim routines are required. Secondly, the input capacitor cannot be trimmed while monitoring the operational amplifier's output. For each step change in the capacitor the entire cycle (sample/reset and amplify/compare) must be repeated. The combination of these two requirements increases the required die area and trim line leading to a less than optimal solution.

SUMMARY OF THE INVENTION

The present invention reduces the time required to self-calibrate a switched capacitor gain stage, as compared to the prior art method described above. In addition, the present invention reduces the required structure. Only a single calibration step is required, which is done while the output of the amplifier being calibrated is monitored.

In accordance with an embodiment of the invention, a method of calibrating a switched capacitor gain stage comprises:

(a) applying reference voltages to a gain stage comprising
  (i) an operational amplifier having a non-inverting input connected to ground
  (ii) an output node Z of the operational amplifier connected via a switch $S_3$ to an inverting input of the operational amplifier,
  (iii) a capacitor $C_b$ connected from the inverting input via a switch $S_{2a}$ to one of the reference voltages Vb1 and via a switch $S_{2b}$ to another of the reference voltages Vb2,
  (iv) an input capacitor $C_a$ connected from the inverting input, via a switch $S_{1a1}$ to another of the reference voltages $V_{b0}$,
  (v) a switch $S_{1b1}$ connected between the junction of switch S1a1 and capacitor $C_a$ and ground,
  (vi) a plurality of trim capacitors, each connected from the inverting input, via respective switches $S_{1a2}$ . . . $S_{1bn}$ to the reference voltage $V_{b0}$, and
  (vii) a plurality of switches $S_{1b2}$ . . . $S_{1bn}$ connected between the junction of a respective corresponding switch s1a2 . . . S1an and ground,
(b) closing switches $S_3$, $S_{1a1}$, $S_{1a2}$ . . . $S_{1an}$ and $S_{2a}$,
(c) opening switch $S_3$,
(d) opening switch $S_{2a}$ and closing switch $S_{2b}$,
(e) opening switch $S_{1a1}$ and closing switch $S_{1b1}$,
(f) opening successive ones of switches $S_{1a2}$ . . . $S_{1an}$ and closing corresponding successive ones of switches $S_{1b2}$ . . . $S_{1bn}$ until either:

(I) a voltage at the inverting input of the operational amplifier is 0, or (II) a voltage at the output of the operational amplifier is equal to a desired gain of the switched capacitor gain stage multiplied by the reference voltage $V_{b0}$, wherein:

the desired gain of the switched capacitor gain stage = $(V_{b2}-V_{b1})/V_{b0}$, and the capacitance $C_a$ is smaller than the desired gain of the switched capacitor gain stage multiplied by the capacitance $C_b$.

In accordance with another embodiment, a switched capacitor gain stage comprises:

(i) an operational amplifier having a non-inverting input connected to ground, (ii) an output node Z of the operational amplifier connected via a switch $S_3$ to an inverting input of the operational amplifier, (iii) a capacitor $C_b$ connected from the inverting input via a switch $S_{2a}$ to a node for applying reference voltage $V_{b1}$ and via a switch $S_{2b}$ to a node for applying another reference voltage $V_{b2}$, (iv) an input capacitor $C_a$ connected from the inverting input, via a switch $S_{1a1}$ to a node for applying another reference voltage $V_{b0}$, (v) a switch $S_{1b1}$ connected between the junction of switch S1a1 and capacitor $C_a$ and ground, (vi) a plurality of trim capacitors, each connected from the inverting input, via respective switches S1a2 . . . S1bn to the reference voltage node $V_{b0}$, and (vii) a plurality of switches $S_{1a2}$ . . . $S_{1bn}$ connected between the junction of a respective corresponding switch $S_{1a2}$ . . . $S_{1an}$ and ground.

In accordance with another embodiment, a method of calibrating a switched capacitor gain stage comprises:

(a) applying reference voltages to a differential gain stage comprising:

(i) a differential amplifier having a pair of inputs and a pair of output nodes, (ii) each respective output node being connected via a corresponding respective switch $S_3$ to a corresponding inverting input and a corresponding non-inverting input, (iii) a pair of capacitors $C_b$ respectively connected from a corresponding input via a corresponding switch $S_{2a}$ to a corresponding reference voltage $V_{b2}$ and $V_{b3}$, and via a corresponding switch $S_{2b}$ to the corresponding voltage $V_{b3}$ and $V_{b2}$ respectively, (iv) a pair of input capacitors $C_a$ connected from respective inputs, via a pair of corresponding switches $S_{1a}$ to a common junction node, (v) a pair of switches $S_{1b1}$ respectively connected between the junctions of switches $S_{1a1}$ and capacitors $C_a$ to respective voltages $V_{b1}$ and $V_{b0}$, and (vi) two groups of trim capacitors, one terminal of each trim capacitor in each respective group connected from a respective input to the differential amplifier, via a corresponding switch $s_{1a2}$ . . . $S_{1an}$ to the common junction node, (b) closing switches $S_3$, $S_{1a1}$, $S_{1a2}$ . . . $S_{1an}$ and $S_{2a}$, (c) opening switches $S_3$, (d) opening switches $S_{2a}$ and closing switches $S_{2b}$, (e) opening switches $S_{1a1}$ and closing switches $S_{1b1}$, (f) opening successive ones of switches $S_{1a2}$ . . . $S_{1an}$ and closing corresponding successive ones of switches $S_{1b2}$ . . . $S_{1bn}$ until either:

(I) a voltage across the outputs of the operational amplifier is 0, or (II) a voltage across the outputs of the operational amplifier is $V_{b3}-V_{b2}$.

In accordance with another embodiment of the invention, a switched capacitor gain stage comprises:

(i) a differential amplifier having a pair of inputs and a pair of output nodes, (ii) each respective output node being connected via a corresponding respective switch S3 to a corresponding inverting input and a corresponding non-inverting input, (iii) a pair of capacitors $C_b$ respectively connected from a corresponding input via a corresponding switch $S_{2a}$ to a reference node for applying corresponding reference voltages $V_{b2}$ and $V_{b3}$, and via a corresponding switch $S_{2b}$ to the node for applying corresponding voltages $V_{b3}$ and $V_{b2}$ respectively, (iv) a pair of input capacitors Ca connected from respective inputs, via a pair of corresponding switches S1a to a common junction node, (v) a pair of switches $S_{1b1}$ respectively connected between the junctions of switches $S_{1a1}$ and capacitors $C_a$ to nodes for applying respective voltages $V_{b1}$ and $V_{b0}$, and (vi) two groups of trim capacitors, one terminal of each trim capacitor in each respective group connected from a respective input to the differential amplifier, via a corresponding switch $s_{1a2}$ . . . $S_{1an}$ to the common junction node.

In accordance with another embodiment, a switched capacitor gain stage is comprises of a logic circuit for (a) closing switches $S_3$, $S_{1a1}$, $S_{1a2}$ . . . $S_{1an}$ and $S_{2a}$, (b) opening switches $S_3$, (c) opening switches $S_{2a}$ and closing switches $S_{2b}$, (d) opening switches $S_{1a1}$ and closing switches $S_{1b1}$, (e) opening successive ones of switches $S_{1a2}$ . . . $S_{1an}$ and closing corresponding successive ones of switches $S_{1b2}$ . . . $S_{1bn}$ until either:

(I) a voltage across the outputs of the operational amplifier is 0, or (II) a voltage across the outputs of the operational amplifier is $V_{b3}-V_{b2}$.

BRIEF DESCRIPTION OF THE DRAWINGS

A better understanding of the invention will be obtained by a consideration of the detailed description below, in conjunction with the following drawings, in which.

DETAILED DESCRIPTION OF EMBODIMENTS OF THE INVENTION

Figure 1:
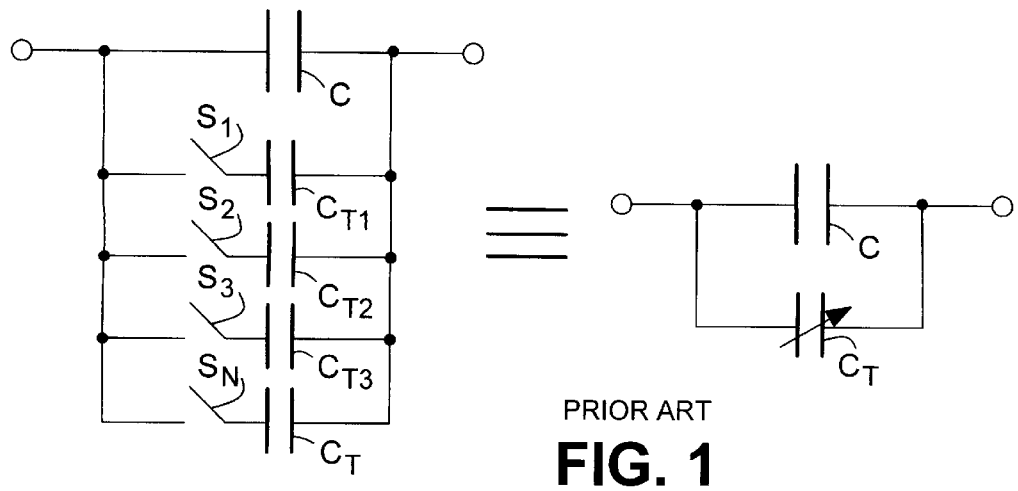
FIG. 1 is a simplified schematic diagram of a capacitor being trimmed with trim capacitors.
Figure 2:
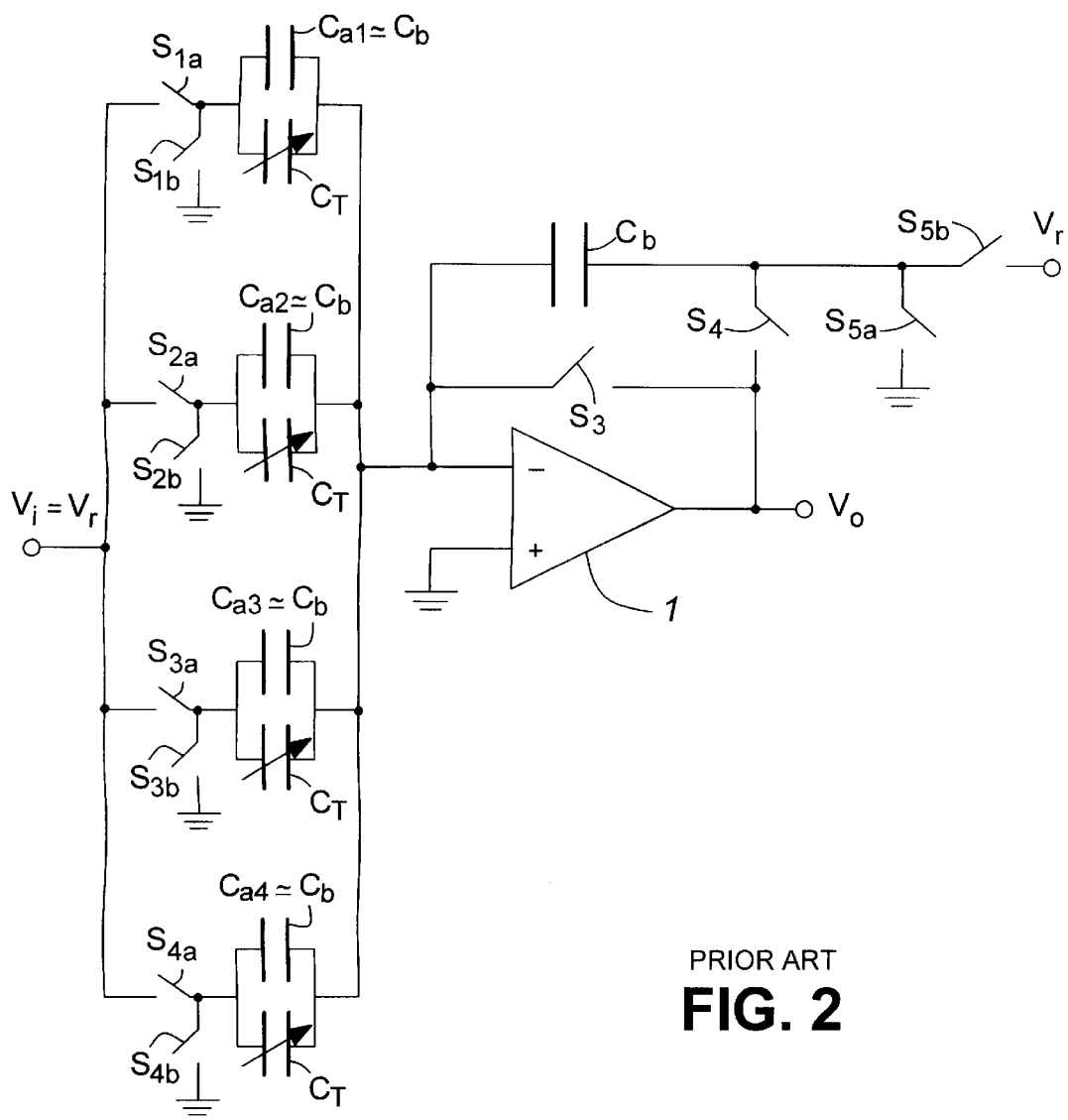
FIG. 2 is a schematic diagram of a switched-capacitor gain stage in accordance with the prior art.
Figure 3:
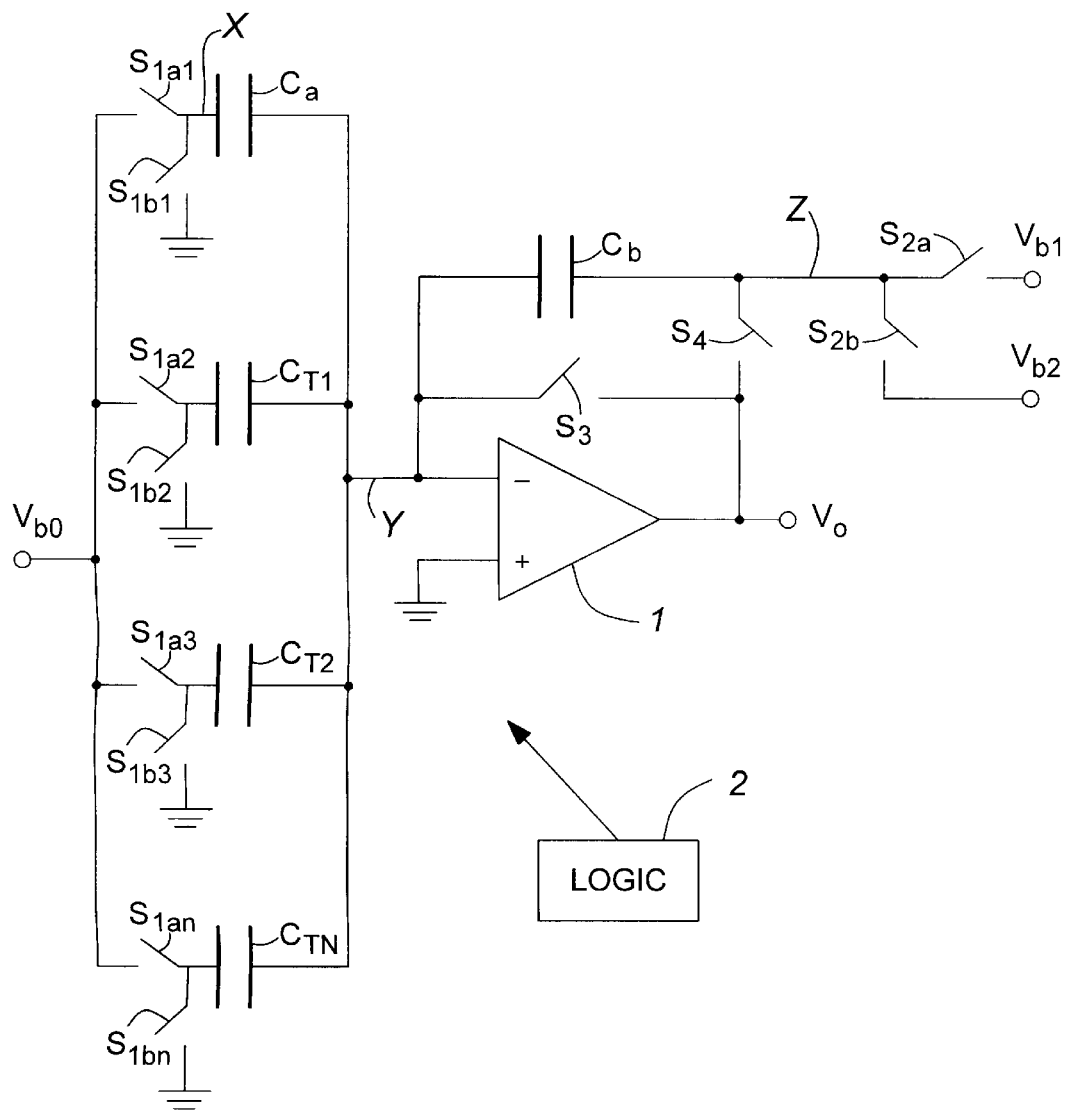
FIG. 3 is a schematic diagram of a switched-capacitor gain stage used to describe a first structural embodiment and a first method embodiment of the present invention.

Turning to FIG. 3, the structure is similar to that of FIG. 2, except that switch $S_{2a}$ replaces switch $S_{5b}$ and is connected to a voltage reference (node) $V_{b1}$, and switch $S_{2b}$ replaces switch $S_{5a}$ and is connected to a voltage reference (node) $V_{b2}$. The input voltage, instead of voltage $V_i=V_r$, is $V_{b0}$.

Instead of utilizing a plurality of capacitors $C_{a1}$–$C_{aN}$ each in parallel with groups of trim capacitors $C_T$, a single capacitor $C_a$ is used, connected to switches $S_{1a1}$ and $S_{1b1}$ in place of switches $S_{1a}$ and $S_{1b}$. Instead of a group of trim capacitors $C_T$ being connected in parallel with the capacitor to be trimmed, each of plural trim capacitors $C_{T1}$–$C_{TN}$ is connected between the input to the operational amplifier 1 and a corresponding switch $S_{1a2}$–$S_{1aN}$ respectively to the input reference voltage node $V_{b0}$. Switches $S_{1b2}$–$S_{1Bn}$ connect the respective junctions between the trim capacitors $C_{T1}$–$C_{TN}$ to ground.

The input node at which voltage $V_{b0}$ is applied to capacitor $C_a$ is referenced as node X, the inverting input of amplifier 1 is referenced as node Y, and the node at which $V_{b1}$ and $V_{b2}$ are applied to capacitor $C_b$ is referenced as node Z.

A calibration starts with switches $S_3$, $S_{1a1}$, $S_{1a2}$, ... and $S_{2a}$ closed. Switch $S_4$ is permanently open in calibration mode. First $S_3$ and $S_{2a}$ are opened and $S_{2b}$ is closed causing node Z to experience a change in potential of $V_{b2}-V_{b1}$. The potential at node Y will be:

$$V_y = (V_{b2} - V_{b1})\left(\frac{C_b}{C_a + C_b + \Sigma C_T}\right)$$

Then, switch $S_{1a1}$ is opened and $S_{1b1}$ is closed, causing the voltage at node X to change by $-V_{b0}$. Now the potential at node Y will be:

$$V_y = ((V_{b2}-V_{b1})C_b - C_a V_{b0})/(C_a+C_b+\Sigma C_T)$$

If the gain stage is to have a gain G, then $V_{b0}$, $V_{b1}$, and $V_{b2}$ should be related by:

$$G=(V_{b2}-V_{b1})/V_{b0}$$

Which yields:

$$V_y=(G\ V_{b0}C_b - V_{b0}C_a)/(C_a+C_b+\Sigma C_T)$$

Provided $C_a<GC_b$ and a sufficient range of trim capacitance is provided ($\Sigma C_T$), parts of the trim capacitor array can be switched from $V_{b0}$ to ground until either:

1) $V_y=0$ which implies $V_o=0$. At this point the capacitor ratio $C_b$ to $C_a$ plus the switched subset of the trim array will be equal to G.
2) $V_o=GV_{b0}$. At this point the gain stage will have a gain equal to G and will be compensated for the operational amplifier's finite gain.

A logic circuit 2 (which may be a controller) controls operation of the various switches in accordance with the sequence described herein.

In this manner one can calibrate any desired gain with one trim capacitor array and one trimming cycle, provided the desired voltages, $V_{b0}$ and $GV_{b0}$, can be generated. For the case of a gain of unity the voltage $GV_{b0}$ is equal to $V_{b0}$ and no additional reference voltages need be generated.

In addition, by following the switch sequence presented, the need to repeat the sample/reset and amplify/compare cycle each time the trimmed capacitor array is changed is avoided. Consequently, not only can arbitrary gains be calibrated on-chip using this algorithm, but the required number of trim capacitor arrays and the required trim time can be reduced.

Figure 4:
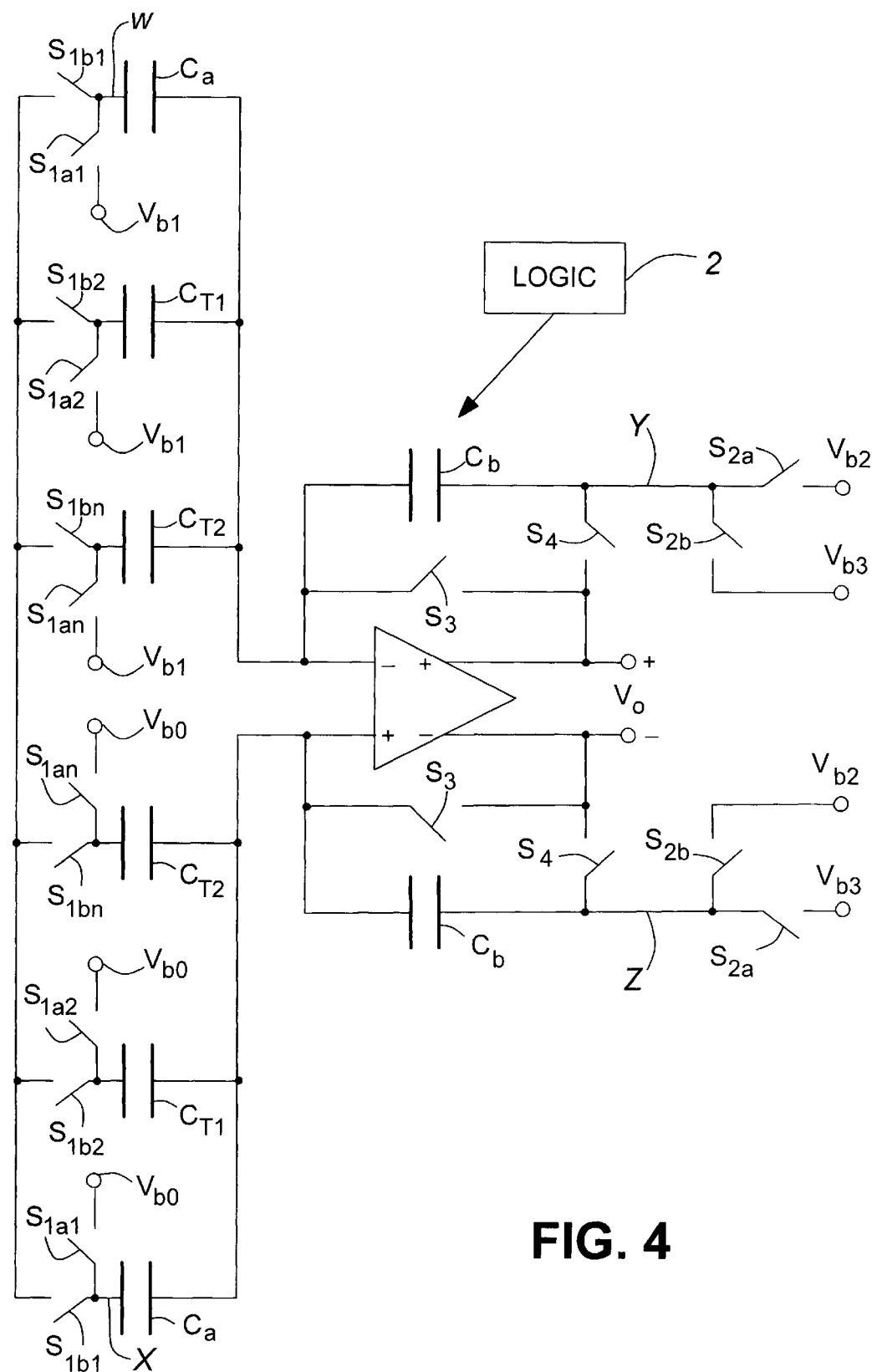
FIG. 4 is a schematic diagram of a switched-capacitor gain stage used to describe a second structure and a second embodiment of the present invention.

The fully differential version of the circuit is shown in FIG. 4. For an ideal differential circuit, the common mode voltage of the signals is unimportant. For practical circuits, the common mode voltage is typically set to the midpoint of the operational amplifier's signal range.

In this embodiment of the invention, a differential amplifier is used in the switched capacitor gain stage. Switches S3 connect the respective output nodes of the differential outputs to corresponding inverting and non-inverting inputs. Respective capacitors $C_b$ connect corresponding inputs to reference voltages at voltage nodes $V_{b2}$ and $V_{b3}$ via respective switches $S_{2a}$, and to reference voltages at voltage nodes $V_{b3}$ and $V_{b2}$ respectively via respective switches $S_{2b}$.

Each differential amplifier input is connected to a separate capacitor $C_a$ to be trimmed. Each of the capacitors $C_a$ is connected via a respective switch $S_{1b1}$ to the same common node.

Groups of trim capacitors, one group for each capacitor to be trimmed, are connected with one node of each trim capacitor of a group to a corresponding differential amplifier input, and with another node to the common node via respective switches $S_{1b2}$–$S_{1bn}$. The junctions between one group of the trim capacitors and corresponding switches $S_{1b2}$–$S_{1bn}$ are connected to voltages $V_{b1}$ via switches $S_{1a2}$–$S_{1an}$, and the junctions between the other group of trim capacitors and corresponding switches $S_{1b2}$–$S_{1bn}$ are connected to voltages $V_{b0}$ via corresponding switches $S_{1a2}$–$S_{1an}$.

The junctions between the capacitors $C_b$ and switches $S_{2a}$ are designated Y (for the inverting input side of the differential amplifier) and Z (for the non-inverting input side of the differential amplifier).

The differential circuit differs from the single-ended version in FIG. 3 in that switches $S_{1a1}$–$S_{1an}$ short the inputs together instead of to ground. Then when the positive side (top input branch) is switches from $V_{b1}$ and the negative side (bottom branch) is switched from $V_{b0}$, the differential step across the input capacitors is:

$$\Delta V_{wx}=V_{b0}-V_{b1}$$

At the outputs, nodes y and z, the top branch is switched from $V_{b2}$ to $V_{b3}$ similar to the single-ended version, while the bottom branch is switched from $V_{b3}$ to $V_{b2}$. This results in a differential change in the voltage between nodes y and z of:

$$\Delta V_{yz}=2(V_{b3}-V_{b2})$$

While monitoring the operational amplifier's outputs ($V_o$), the input capacitor array can be trimmed as was done previously until either:

1) $V_o=0$ at which point the ratio of the input capacitor array to the output capacitor $C_b$ will be equal to:

$$G=2(V_{b3}-V_{b2})/(V_{b0}-V_{b1})$$

2) $V_o=(V_{b3}-V_{b2})$ at which point the gain stage will have a gain equal to:

$$G=2(V_{b3}-V_{b2})/(V_{b0}-V_{b1})$$

As described with reference to FIG. 3, logic circuit 2 or a controller controls operation of the various switches in the sequence described.

For the special case where $V_{b1}-V_{b0}=V_{b3}-V_{n2}$ either the capacitor ratio will be equal to 2, if condition (1) is met, or the gain stage will have a gain of exactly 2, if condition (2) is met. Hence, precise gains of 2 can be calibrated without the need to generate specific voltages on-chip. This makes this embodiment of the technique especially well suited to the implementation or many ADC architectures for high-resolution applications.

A person understanding this invention may now conceive of alternate embodiments and enhancements using the principles described herein. All such embodiments and enhancements are considered to be within the spirit and scope of this invention as defined in the claims appended hereto.

I claim:

1. A method of calibrating a switched capacitor gain stage comprising:
   (a) applying reference voltages to a gain stage comprising
      (i) an operational amplifier having a non-inverting input connected to ground
      (ii) an output node Z of the operational amplifier connected via a switch $S_3$ to an inverting input of the operational amplifier,
      (iii) a capacitor $C_b$ connected from the inverting input via a switch $S_{2a}$ to one of the reference voltages $V_{b1}$ and via a switch $S_{2b}$ to another of the reference voltages $V_{b2}$,
      (iv) an input capacitor $C_a$ connected from the inverting input, via a switch $S_{1a1}$ to another of the reference voltages $V_{b0}$,
      (v) a switch $S_{1b1}$ connected between the junction of switch $S_{1a1}$ and capacitor $C_a$ and ground,
      (vi) a plurality of trim capacitors, each connected from the inverting input, via respective switches $S_{1a2} \ldots S_{1an}$ to the reference voltage $V_{b0}$, and
      (vii) a plurality of switches $S_{1b2} \ldots S_{1bn}$ connected between the junction of a respective corresponding switch $s_{1a2} \ldots S_{1an}$ and ground,
   (b) closing switches, $S_3, S_{1a1}, S_{1a2} \ldots S_{1an}$ and $S_{2a}$,
   (c) opening switch $S_3$,
   (d) opening switch $S_{2a}$ and closing switch $S_{2b}$,
   (e) opening switch $S_{1a1}$ and closing switch $S_{1b1}$,
   (f) opening successive ones of switches $S_{1a2} \ldots S_{1an}$ and closing corresponding successive ones of switches $S_{1b2} \ldots S_{1bn}$ until either:
      (I) a voltage at the inverting input of the operational amplifier is 0, or
      (II) a voltage at the output of the operational amplifier is equal to a desired gain of the switched capacitor gain stage multiplied by the reference voltage $V_{b0}$,
   wherein:
      the desired gain of the switched capacitor gain stage=$(V_{b2}-V_{b1})/V_{b0}$, and
      the capacitance $C_a$ is smaller than the desired gain of the switched capacitor gain stage multiplied by the capacitance $C_b$.

2. A switched capacitor gain stage comprising:
   (i) an operational amplifier having a non-inverting input connected to ground
   (ii) an output node $V_0$ of the operational amplifier connected via a switch $S_3$ to an inverting input of the operational amplifier,
   (iii) a capacitor $C_b$ connected from the inverting input via a switch $S_{2a}$ to a node for applying reference voltage $V_{b1}$ and via a switch $S_{2b}$ to a node for applying another reference voltage $V_{b2}$,
   (iv) an input capacitor $C_a$ connected from the inverting input, via a switch $S_{1a1}$ to a node for applying another reference voltage $V_{b0}$,
   (v) a switch $S_{1b1}$ connected between the junction of switch S1a1 and capacitor $C_a$ and ground,
   (vi) a plurality of trim capacitors, each connected from the inverting input, via respective switches $S_{1a2} \ldots S_{1an}$ to the reference node $V_{b0}$, and
   (vii) a plurality of switches $S_{1b2}-S_{1bn} \ldots s_{1an}$ connected between the junction of a respective corresponding switch $s_{1a2} \ldots S_{1an}$ and ground.

3. A switched capacitor gain stage as defined in claim 2, including a logic circuit for:
   (a) closing switches $S_3, S_{1a1}, S_{1a2} \ldots S_{1an}$ and $S_{2a}$,
   (b) opening switch $S_3$,
   (c) opening switch $S_{2a}$ and closing switch $S_{2b}$,
   (d) opening switch $S_{1a1}$ and closing switch $S_{1b1}$,
   (e) opening successive ones of switches $S_{1a2} \ldots S_{1an}$ and closing corresponding successive ones of switches $S_{1b2} \ldots S_{1bn}$ until either:
      (I) a voltage at the inverting input of the operational amplifier is 9, or
      (II) a voltage at the output of the operational amplifier is equal to a desired gain of the switched capacitor gain stage multiplied by the reference voltage $V_{b0}$,
   wherein:
      the desired gain of the switched capacitor stage=$(V_{b2}-V_{b1})/V_{b0}$, and
      the capacitance Ca is smaller than the desired gain of the switched capacitor gain stage multiplied by the capacitance $C_b$.

4. A switched capacitor gain stage as defined in claim 3, in which the logic circuit is a processor.

5. A method of calibrating a switched capacitor gain stage comprising:
   (a) applying reference voltages to a differential gain stage comprising:
      (i) a differential amplifier having a pair of inputs and a pair of output nodes,
      (ii) each respective output node being connected via a corresponding respective switch $S_3$ to a corresponding inverting input and a corresponding non-inverting input,
      (iii) a pair of capacitors $C_b$ respectively connected from a corresponding input via a corresponding switch $S_{2a}$ to a corresponding reference voltage $b_2$ and $V_{b3}$, and via a corresponding switch $S_{2b}$ to the corresponding voltage $V_{b3}$ and $V_{b2}$ respectively,
      (iv) a pair of input capacitors Ca connected from respective inputs, via a pair of corresponding switches $S_{1a}$ to respective voltages $V_{b1}$ and $V_{b0}$,
      (v) a pair of switches $S_{1b1}$ respectively connected between the junctions of switches $S_{1a1}$ and capacitors $C_a$ to a common junction node, and
      (vi) two groups of trim capacitors, one terminal of each trim capacitor in each respective group connected from a respective input to the differential amplifier, via a corresponding switch $s_{1a2} \ldots S_{1an}$ to the respective voltages $V_{b1}$ and $V_{b0}$,
   (b) closing switches $S_3, S_{1a1}, S_{1a2} \ldots S_{1an}$ and $S_{2a}$,
   (c) opening switches $S_3$,
   (d) opening switches, $S_{2a}$ and closing switches $S_{2b}$,
   (e) opening switches $S_{1a1}$ and closing switches $S_{1b1}$,
   (f) opening successive ones of switches $S_{1a2} \ldots S_{1an}$ and closing corresponding successive ones of switches $S_{1b2} \ldots S_{1bn}$ until either:
      (I) a voltage across the outputs of the operational amplifier is 0, or
      (II) a voltage across the outputs of the operational amplifier is $V_{b3}-V_{b2}$.

6. A switched capacitor gain stage comprising:
(i) a differential amplifier having a pair of inputs and a pair of output nodes,
(ii) each respective output node being connected via a corresponding respective switch $S_3$ to a corresponding inverting input and a corresponding non-inverting input,
(iii) a pair of capacitors $C_b$ respectively connected from a corresponding input via a corresponding switch $S_{2a}$ to a reference node for applying corresponding reference voltages $B_{b2}$ and $V_{b3}$, and via a corresponding switch $S_{2b}$ to the node for applying corresponding voltages $V_{b3}$ and $V_{b2}$ respectively,
(iv) a pair of input capacitors $C_a$ connected from respective inputs, via a pair of corresponding switches $S_{1a}$ to nodes for applying respective voltages $V_{b1}$ and $V_{bo}$,
(v) a pair of switches $S_{1b1}$ respectively connected between the junctions of switches $S_{1a1}$ and capacitors $C_a$ to a common junction node, and
(vi) two groups of trim capacitors, one terminal of each trim capacitor in each respective group connected from a respective input to the differential amplifier, via a corresponding switch $S_{1a2} \ldots S_{1an}$ to the nodes for applying respective voltages $V_{b1}$ and $V_{bo}$.

7. A switched capacitor gain stage as defined in claim 6 including a logic circuit for
(a) closing switches $S_3$, $S_{1a1}$, $S_{1a2} \ldots S_{1an}$ and $S_{2a}$,
(b) opening switches $S_3$,
(c) opening switches $S_{2a}$ and closing switches $S_{2b}$,
(d) opening switches $S_{1a1}$ and closing switches $S_{1b1}$,
(e) opening successive ones of switches $S_{1a2} \ldots S_{1an}$ and closing corresponding successive ones of switches $S_{1b2} \ldots S_{1bn}$ until either:
(I) a voltage across the outputs of the operational amplifier is 0, or
(II) a voltage across the outputs of the operational amplifier is $V_{b3} - V_{b2}$.

8. A switched capacitor gain stage as defined in claim 7, in which the logic circuit is a processor.

* * * * *

UNITED STATES PATENT AND TRADEMARK OFFICE
CERTIFICATE OF CORRECTION

PATENT NO. : 6,011,433
DATED : January 4, 2000
INVENTOR(S) : David Graham Nairn

It is certified that error appears in the above-identified patent and that said Letters Patent is hereby corrected as shown below:

Column 2,
Line 38, delete "Z" and substitute -- $V_o$ --;

Column 3,
Line 16, delete "Z" and substitute -- $V_o$ --;

Column 7,
Line 16, delete "Z" and substitute -- $V_o$ --.

Signed and Sealed this

Seventeenth Day of December, 2002

JAMES E. ROGAN
*Director of the United States Patent and Trademark Office*